(12) United States Patent
Kumar et al.

(10) Patent No.: US 8,130,579 B2
(45) Date of Patent: Mar. 6, 2012

(54) MEMORY DEVICE AND METHOD OF OPERATION THEREOF

(75) Inventors: Ashish Kumar, Greater Noida (IN); Piyush Jain, Greater Noida (IN)

(73) Assignee: STMicroelectronics Pvt. Ltd., Greater Noida (UP) (IN)

( * ) Notice: Subject to any disclaimer, the term of this patent is extended or adjusted under 35 U.S.C. 154(b) by 169 days.

(21) Appl. No.: 12/717,019

(22) Filed: Mar. 3, 2010

(65) Prior Publication Data
US 2011/0149668 A1     Jun. 23, 2011

(30) Foreign Application Priority Data
Dec. 21, 2009   (IN) .......................... 2673/DEL/2009

(51) Int. Cl.
*G11C 7/00*   (2006.01)

(52) U.S. Cl. ............. 365/203; 365/189.15; 365/189.19; 365/154

(58) Field of Classification Search .................. 365/203, 365/189.15, 189.19, 154
See application file for complete search history.

(56) References Cited

U.S. PATENT DOCUMENTS

| 6,400,594 B2 * | 6/2002 | Hata et al. .................... 365/49.1 |
| 6,934,213 B2 | 8/2005 | Becker |

* cited by examiner

*Primary Examiner* — Son Dinh
*Assistant Examiner* — Nam Nguyen
(74) *Attorney, Agent, or Firm* — Hogan Lovells US LLP

(57) ABSTRACT

Memory devices and methods of operating a memory cell are disclosed in which a bitline can be grounded after charge sharing with an electrically floating ground line and before writing data to the memory cell. An electric potential of an upper power supply node of a memory cell can be lowered and an electric potential of a lower power supply node of the memory cell can be raised before writing data to the memory cell.

23 Claims, 6 Drawing Sheets

MEMORY DEVICE AND METHOD OF OPERATION THEREOF

RELATED APPLICATION

The present application claims priority of India Patent Application No. 2673/Del/2009 filed Dec. 21, 2009, which is incorporated herein in its entirety by this reference.

FIELD OF THE INVENTION

The present disclosure relates to memory devices such as static memory devices (SRAM) having a relatively low power consumption.

BACKGROUND OF THE INVENTION

Due to high demands of portable devices, power consumption has become a major concern in chip design, especially in embedded memories, in particular static random access memory (SRAM). Memory can contribute significantly to the power consumption of the chip or chips of the device.

For reducing the power consumption of a memory device, it has been proposed to reduce the power supply voltage of memory devices. A reduction of the power supply voltage can reduce the power required for charging electrically conductive lines in the memory device, in particular wordlines and bitlines, to the power supply voltage.

However, in SRAM devices operated at a relatively low power supply voltage, a reduced writability of memory cells of the SRAM device can be an issue, since a voltage applied to a transistor in a memory cell may be insufficient for overcoming the threshold voltage of the transistor. Technology scaling may increase this problem, since a reduction of critical dimensions of circuit elements of the memory devices may lead to an increase of process variation and, hence, to a broader distribution of threshold voltages of transistors in the memory device. The reduced writability of memory cells can be a serious threat to the functionality of memory devices and thus to the yield of the manufacturing of memory devices.

To address the problem of a reduced writability of memory devices, various write assist methods have been proposed. Such methods include a reduction of the power supply voltage for columns of memory cells, a negative bitline approach, wherein bitlines of the memory device are charged to a voltage smaller than ground voltage during writing processes, a raising of the ground voltage for columns of memory cells during writing processes, and boosted wordline schemes, wherein it is attempted to overdrive access transistors of memory cells. However, the existing approaches can lead to an increase of the power consumption of the memory device, or may require a relatively large chip area for required circuitry, and can be unsuitable for low speed, low power applications such as medical applications.

U.S. Pat. No. 6,934,213 discloses an example of a method and a circuit for reducing power consumption during write operations in a RAM. In a RAM comprising of a plurality of memory cells, the bit lines that are coupled to each memory cell in the RAM and used to read and write data into the cell are coupled through charge share control circuitry to a charge sharing line. During write operations, the bit line that will receive a zero value is coupled to the charge share line before data is written to the cell. The charge share line equalizes the charge on the selected bit line and the charge share line and reduces the voltage differential that must be swung to write data into the cell.

In the method of U.S. Pat. No. 6,934,213, bitlines (which can be true bitlines and complementary bitlines) are never pulled down to ground voltage, since, due to the charge sharing with the charge sharing line that is performed instead of grounding the bitlines, the bitlines are never discharged completely. This can reduce the voltage between gate and source of field effect transistors in the memory cells compared to memory devices wherein the bitlines are completely discharged. Under low writability conditions of a memory cell, wherein the memory cell has a relatively low write voltage, this can have the consequence that the memory cell is not writeable. For example, if the charge share line attains a voltage of 300 mV and the write voltage of the memory cell is 150 mV, the memory cell cannot be written, even if the raising of the ground voltage of the memory cell that is provided by the charge share line helps to improve the writability of the memory cell to a certain extent. If deep submicron technologies are employed for the manufacturing of a memory device, the spread of write voltages of memory cells in a memory device can be relatively high, which increases the likelihood of write failure occurring. These issues can adversely affect the functionality of a memory device according to U.S. Pat. No. 6,934,213, in particular if it is operated at a low power supply voltage.

It is an object of the present subject matter to provide a memory device and a method of operation thereof that help to overcome the above-mentioned problems.

SUMMARY OF THE INVENTION

Herein, a method of operating a memory cell is disclosed. The memory cell is connected to a wordline and at least one bitline, and comprises an upper power supply node connected to a power supply and a lower power supply node. The lower power supply node is electrically connected to a ground line. A standby state of the memory cell is provided. In the standby state, a precharge voltage is applied to the bitline and the ground line is grounded. A write operation is performed. In the write operation, the ground line is electrically disconnected from ground, and the bitline is electrically connected to the ground line for charge sharing between the bitline and the ground line. After the charge sharing, the bitline is electrically disconnected from the ground line, the bitline is electrically connected to ground, and a voltage pulse is applied to the wordline.

Another method of operating a memory cell is also disclosed. The memory cell is connected to a wordline and a bitline. The memory cell comprises an upper power supply node and a lower power supply node. A standby state of the memory cell is provided. In the standby state, a power supply voltage is applied to the upper power supply node and the lower power supply node is grounded. A write operation is performed. In the write operation, an electric potential of the upper power supply node is lowered relative to the power supply voltage and the electric potential of the lower power supply node is raised relative to ground potential. A voltage selected in accordance with data to be written into the memory cell is applied to the bitline, and a voltage pulse is applied to the wordline. The lowering of the electric potential of the upper power supply node and the raising of the electric potential of the lower power supply node can be performed by providing an electrical connection between a power supply line electrically connected to the upper supply node and a ground line electrically connected to the lower power supply node for charge sharing between the power supply line and the ground line.

A memory device is also disclosed. The memory device comprises a column of memory cells, a bitline and a plurality of wordlines. Each memory cell in the column of memory cells is connected to the bitline, and each wordline is connected to a respective one of the memory cells. Each memory cell comprises an upper power supply node connected to a power supply and a lower power supply node. The memory device further comprises a ground line, wherein the lower power supply node of each of the memory cells in the column of memory cells is electrically connected to the ground line. A control circuit is connected to the memory cells. The control circuit is adapted for providing a standby state of the column of memory cells and for performing a write operation. When providing the standby state, the control circuit applies a precharge voltage to the bitline, and electrically connects the ground line to ground. When performing the write operation, the control circuit electrically disconnects the ground line from ground, and electrically connects the bitline to the ground line for charge sharing between the bitline and the ground line. After the charge sharing, the control circuit electrically disconnects the bitline from the ground line, electrically connects the bitline to ground and applies a voltage pulse to a wordline connected to one of the memory cells for writing data into the one of the memory cells.

Another memory device is also disclosed. The memory device comprises a column of memory cells, a first bitline, a second bitline, and a plurality of wordlines. Each memory cell in the column of memory cells is connected to the first bitline and the second bitline. Each wordline is connected to a respective one of the memory cells. Each memory cell comprises an upper power supply node electrically connected to a power supply line and a lower power supply node electrically connected to a ground line. A control circuit is connected to the column of memory cells. The control circuit is adapted for providing a standby state of the column of memory cells and for performing a write operation. When providing the standby state, the control circuit applies a power supply voltage to the power supply line and connects the ground line to ground. When performing the write operation, the control circuit lowers an electric potential of power supply line relative to the power supply voltage and raises an electric potential of the ground line relative to ground potential. Additionally, the control circuit applies a voltage selected in accordance with data to be written into the memory cell to the bitline and applies a voltage pulse to a wordline connected to one of the memory cells for writing data into the one of the memory cells. The lowering of the electric potential of the power supply line and the raising of the electric potential of the ground line can comprise providing an electrical connection between the power supply line and the ground line for charge sharing between the power supply line and the ground line.

BRIEF DESCRIPTION OF THE DRAWINGS

Embodiments will now be described with reference to the accompanying figures, wherein.

DETAILED DESCRIPTION OF PREFERRED EMBODIMENTS

Figure 1:
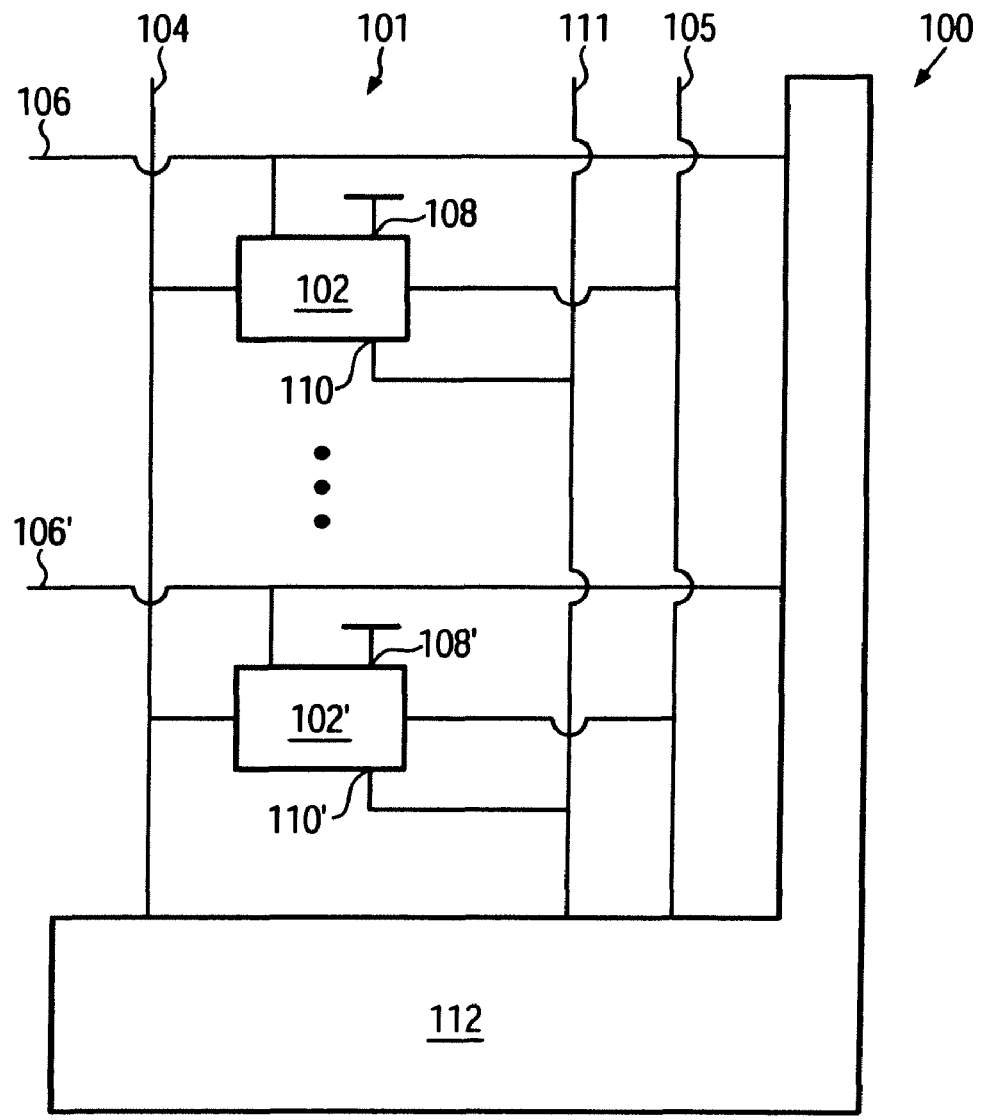
FIG. 1 shows a schematic block diagram of a memory device according to an embodiment.

FIG. 1 shows a schematic block diagram of a memory device 100 according to an embodiment. The memory device 100 comprises a column 101 of memory cells. In addition to the column 101, the memory device 100 can comprise further columns of memory cells having a configuration corresponding to that of column 101. For simplicity, in FIG. 1, the other columns of memory cells have been omitted.

The column 101 comprises memory cells 102, 102'. Dots in FIG. 1 schematically indicate that additional memory cells can be provided between the memory cells 102, 102'. The memory cells in column 101, and in other columns of memory cells in the memory device 100, can form a matrix of memory cells.

The column 101 of memory cells can comprise a first bitline 104 and a second bitline 105 that can be complementary to the first bitline 104. Each of the memory cells 102, 102' in column 101 can be connected to the first bitline 104 and the second bitline 105.

The present disclosure, however, is not limited to embodiments wherein each memory cell is connected to two bitlines. In other embodiments, each column of memory cells can comprise a single bitline, each of the memory cells in the memory device being connected to the bitline associated with the column of memory cells wherein the memory cell is located.

The memory device 100 further comprises a plurality of wordlines 106, 106'. Each wordline 106, 106' can be connected to one memory cell in the column 101. For example, wordline 106 is connected to memory cell 102 and wordline 106' is connected to memory cell 102'. In addition to being connected to a respective one of the memory cells 102, 102' in column 101, each of the wordlines 106, 106' can further be connected to memory cells in other columns of the memory device 100, wherein the memory cells connected to one of the wordlines form a row of the matrix of memory cells.

Each memory cell of the memory device 100 can comprise an upper power supply node and a lower power supply node. In FIG. 1, the upper power supply nodes of memory cells 102, 102' are denoted by reference numerals 108 and 108', respectively, and the lower power supply nodes of memory cells 102, 102' are denoted by reference numerals 110 and 110', respectively.

The upper power supply nodes 108, 108' can be electrically connected to a power supply providing a power supply voltage Vdd. The lower power supply nodes 110, 110' can be electrically connected to a ground line 111 of the column 101 of memory cells.

The memory device 100 further comprises a control circuit 112. The bitlines 104, 105, the ground line 111 and the wordlines 106, 106' can be connected to the control circuit 112, such that the control circuit 112 can control electric voltages that are applied to the bitlines 104, 105, the ground line 111 and the wordlines 106, 106 for reading and writing data to the memory device 100.

Figure 2:
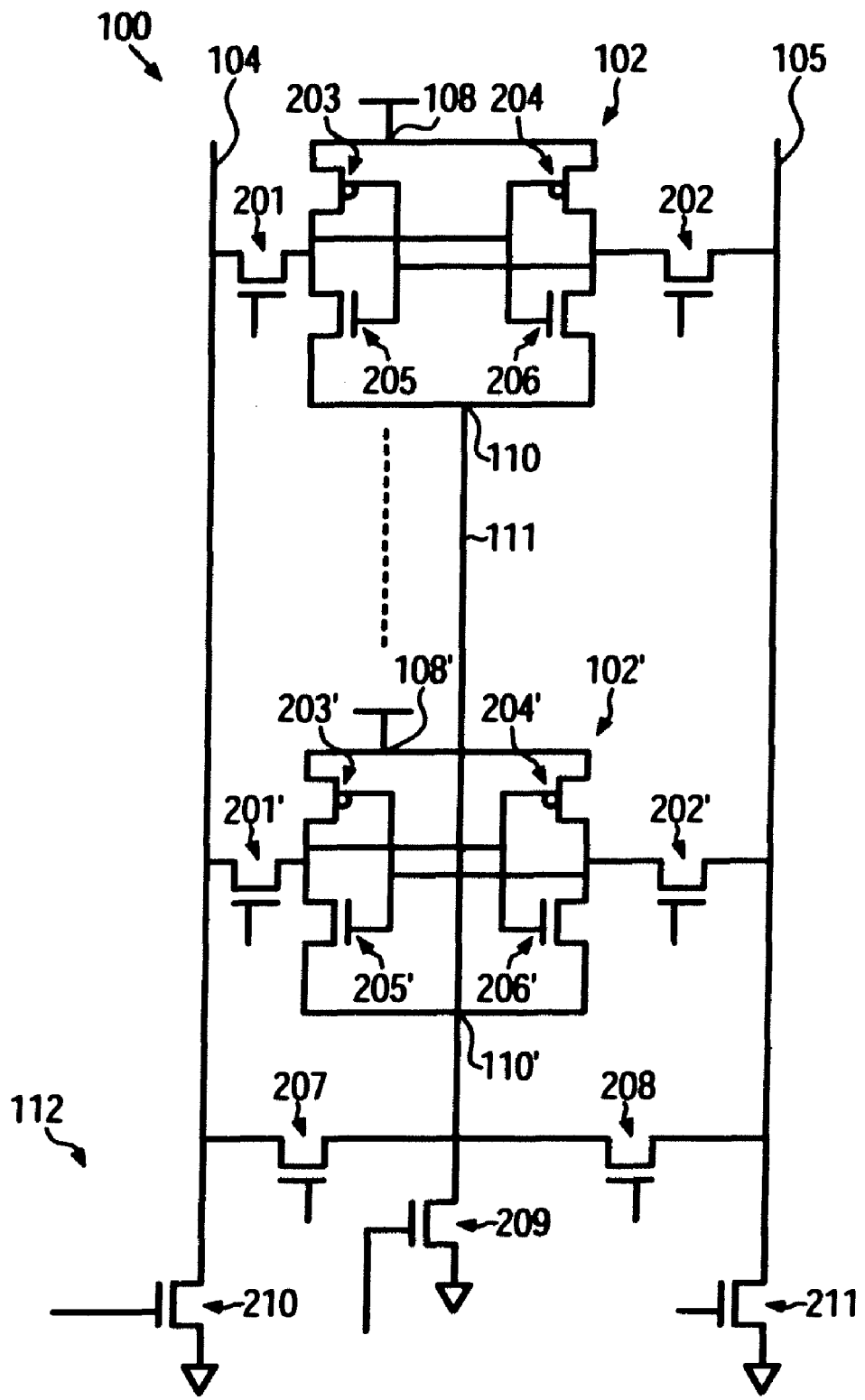
FIG. 2 shows a simplified circuit diagram of the memory device shown in FIG. 1.

A simplified circuit diagram of the memory device 100 is shown in FIG. 2. For simplicity, some components of the control circuit 112 and the wordlines 106 and 106' have been omitted.

The memory cell 102 comprises a first pull up transistor 204, a second pull up transistor 203, a first pull down transistor 206 and a second pull down transistor 205. The pull up transistors 203, 204 can be p-channel transistors and the pull down transistors 205, 206 can be n-channel transistors. Sources of the pull up transistors 203, 204 can be electrically connected to the upper power supply node 108 and sources of the pull down transistors 205, 206 can be electrically connected to the lower power supply node 110.

The drains of the first pull up transistor 204 and the first pull down transistor 206 can be electrically connected to each other and to the gates of the second pull up transistor 203 and the second pull down transistor 205. Thus, the first pull up transistor 204 and the first pull down transistor 206 form a first inverter, wherein an input of the first inverter is provided by the gates of the transistors 204, 206, which can be electrically connected to each other, and an output of the first inverter is applied to the gates of the transistors 203, 205.

The drains of the second pull up transistor 203 and the second pull down transistor 205 can be electrically connected to each other and to the gates of the transistors 204, 205. Thus, the transistors 203, 205 form a second inverter, wherein an input of the second inverter is connected to the output of the first inverter and the output of the second inverter is connected to the input of the first inverter.

The first inverter and the second inverter form a latch having two states. In the first state, the drains of the transistors 204, 206 are at a high voltage and the drains of the transistors 203, 205 are at a low voltage. In a second state, the drains of the transistors 204, 206 are at a low voltage and the drains of the transistors 203, 205 are at a high voltage. The first state and the second state can be identified with a logic 1 and a logic 0 stored in the memory cell 102. The high voltage and the low voltage can be substantially equal to the voltage applied at the upper power supply node 108 and the lower power supply node 110, respectively.

A first access transistor 201 connects the input of the first inverter to the first bitline 104, and a second access transistor 202 connects the input of the second inverter to the second bitline 105. The gates of the access transistors 201, 202 are connected to the wordline 106. In some embodiments, the access transistors 201, 202 can be n-channel transistors. If a switching voltage that overcomes the threshold voltage of the access transistors 201, 202 is applied to the gate electrodes of the access transistors 201, 202, the access transistor 201 provides an electrical connection between the first bitline 104 and the input of the first inverter formed by transistors 204, 206, and the access transistor 202 provides an electrical connection between the second bitline 105 and the input of the second inverter formed by transistors 203, 205. Otherwise, the first and the second inverter are electrically disconnected from the bitlines 104, 105.

The structure of memory cell 102' and other memory cells in column 101 as well as in other columns of the memory device 100 can correspond to that of memory cell 102. In FIG. 2, reference numerals with a prime 0 denote components of memory cell 102' corresponding to components of memory cell 102 denoted by like reference numerals without a prime.

The control circuit 112 can comprise a first charge sharing transistor 207 connected between the first bitline 104 and the ground line 111. In some embodiments, the first charge sharing transistor 207 can be an n-channel transistor. If a switching voltage that overcomes a threshold voltage of the first charge sharing transistor 207 is applied to the gate of the first charge sharing transistor 207, the first charge sharing transistor 207 provides an electrical connection between the ground line 111 and the first bitline 104. Otherwise, the first bitline 104 is electrically disconnected from the ground line 111.

The control circuit 112 can further comprise a second charge sharing transistor 208 connected between the second bitline 105 and the ground line 111. Similar to the first charge sharing transistor 207, the second charge sharing transistor 208 can be an n-channel transistor. The second charge sharing transistor provides an electrical connection between the second bitline 105 and the ground line 111 if a switching voltage that overcomes a threshold voltage of the second charge sharing transistor 208 is applied to the gate of the second charge sharing transistor 208. Otherwise, the second bitline 105 is electrically disconnected from the ground line 111.

The control circuit 112 can further comprise a grounding transistor 209 that can, in some embodiments, be an n-channel transistor. The grounding transistor 209 is connected between the ground line 111 and ground, and provides an electrical connection between the ground line 111 and ground if a switching voltage that overcomes a threshold voltage of the grounding transistor 209 is applied to the gate of the grounding transistor 209. Otherwise, the ground line 111 is electrically disconnected from ground, and can be electrically floating.

The control circuit 112 can further comprise a first write transistor 210 connected between the first bitline 104 and ground and a second write transistor 211 connected between the second bitline 105 and ground. In some embodiments, the write transistors 210, 211 can be n-channel transistors. Each of the write transistors 210, 211 provides an electrical connection between the respective bitline 104, 105 and ground if a switching voltage that overcomes a threshold voltage of the write transistors 210, 211 is applied to its gate. Otherwise, the bitlines 104, 105 are electrically disconnected from ground.

The control circuit 112 can further comprise charge sharing transistors, grounding transistors and write transistors connected to the bitlines and ground lines of columns of memory cells other than column 101 in a manner corresponding to that described above for column 101.

In addition to the components described above, the control circuit 112 can further comprise circuitry for providing the functionality described in the following. For providing this functionality of the control circuit 112, known techniques for the design of integrated circuits can be employed. While the functionality of the control circuit 112 will be described with respect to operations performed in the column 101 of memory cells, the control circuit 112 can provide a corresponding functionality for operations performed in other columns of memory cells of the memory device 100.

The control circuit 112 is adapted for providing a standby state of the column 101 of memory cells. In the standby state, a precharge voltage is applied to the bitlines 104, 105 by providing an electrical connection between the bitlines 104, 105 and a voltage source. In some embodiments, the precharge voltage can be approximately equal to the power supply voltage Vdd of the memory device 100. Moreover, in the standby state, the control circuit connects the ground line 111 to ground. For this purpose, the control circuit 112 can apply a switching voltage to the grounding transistor 209. No switching voltage is applied to the access transistors 201, 202, 201', 202', the charge sharing transistors 207, 208, and the write transistors 210, 211. Thus, the memory cells 102, 102' are electrically disconnected from the bitlines 104, 105 and the bitlines 104, 105 are electrically disconnected from the ground line 211 and ground.

Figure 3:
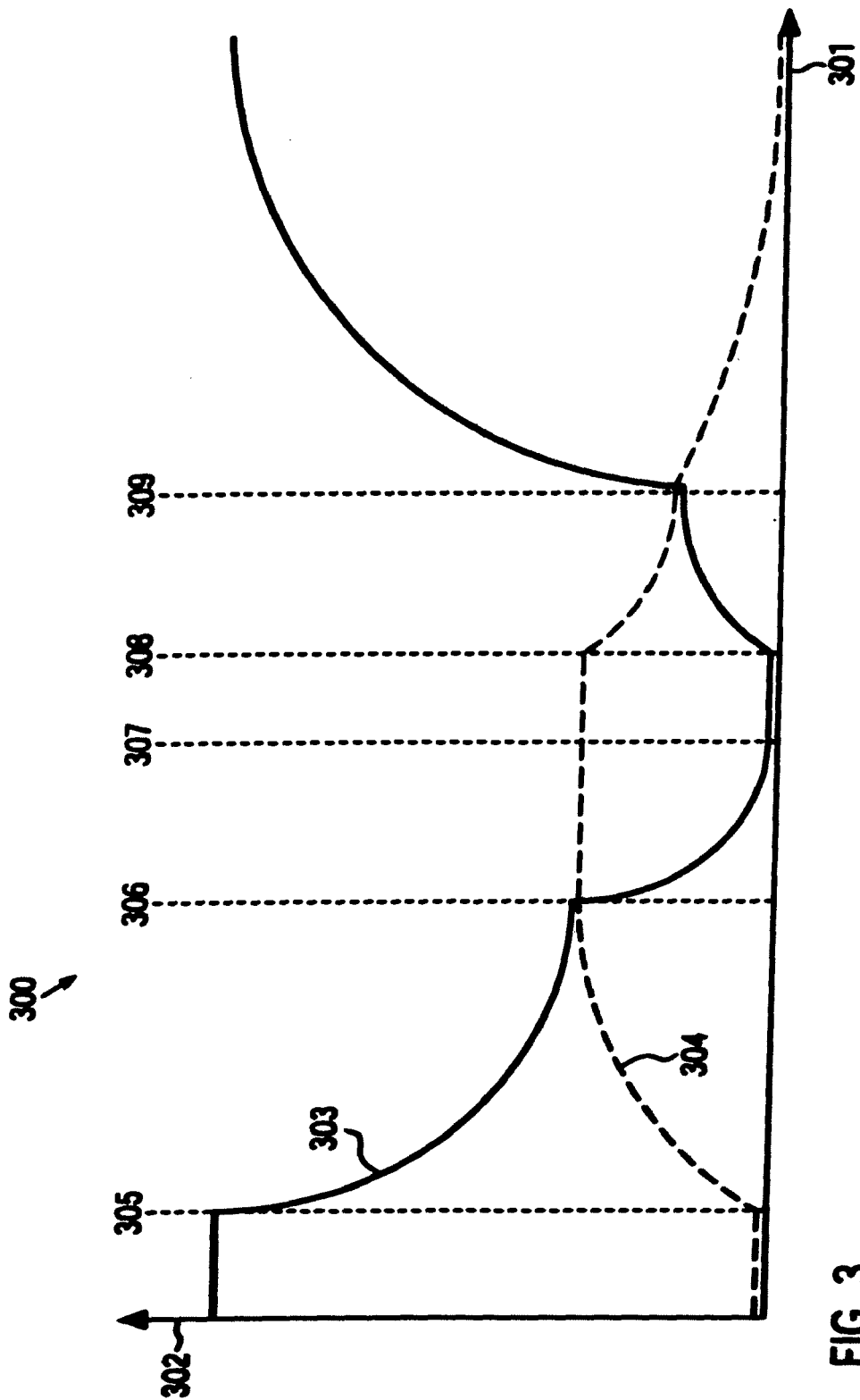
FIG. 3 shows a schematic diagram illustrating voltages in the memory device of FIG. 1.

The control circuit 112 is also adapted for performing a write operation wherein data is written into one of the memory cells 102, 102' of the column 101 of memory cells. FIG. 3 shows a schematic diagram illustrating electric potentials of one of the bitlines 104, 105 (curve 303) and the ground line 111 (curve 304) during the write operation. A horizontal coordinate axis 301 denotes time, and a vertical coordinate axis 302 denotes voltage.

In the write operation, the electric potential of one of the bitlines 104, 105 is lowered, whereas the electric potential of the other of the bitlines 104, 105 is maintained at the precharge voltage. Depending on the bit value to be written into the one or more of the memory cells 102, 102' of column 101 of memory cells, the bitline whose electric potential is lowered can be the first bitline 104 or the second bitline 105. Curve 303 shows the electric potential of the bitline whose electric potential is lowered during the write operation.

In the following, a case wherein the electric potential of the first bitline 104 is lowered during the write operation will be described in more detail. In a case wherein the electric potential of the second bitline 105 is lowered, operations similar to those described in the following are performed, wherein actions performed on the first bitline, the first charge sharing transistor 207 and the first write transistor 208 are replaced with corresponding actions performed on the second bitline 105, the second charge sharing transistor 208 and the second write transistor 211.

In FIG. 3, a vertical dashed line 305 denotes a point of time at which the write operation is started. Before the write operation, the memory device 100 can be in the standby mode, such that the electric potential of bitline 104 is high (substantially equal to the precharge voltage) and the electric potential of the ground line 111 is substantially equal to ground potential.

When performing the write operation, the control circuit 112 electrically disconnects the ground line 111 from ground. This can be done by turning off the switching voltage applied to the gate of the grounding transistor 209. Additionally, the control circuit 112 electrically disconnects the bitline 104 from a voltage source providing the precharge voltage, and electrically connects the bitline 104 to the ground line 111. This can comprise applying a switching voltage to the gate of the first charge sharing transistor 207.

After providing the electrical connection between the bitline 104 and the ground line 111, charge sharing between the first bitline 104 and the ground line 111 occurs, wherein the electric potential of the first bitline 104 decreases and the electric potential of the ground line 111 increases until the electric potentials of the first bitline 104 and the ground line 111 are approximately equal. The electric potential which is asymptotically assumed by the first bitline 104 and the ground line 111 can depend on the ratio between the capacitances of the first bitline 104 and the ground line 111. In embodiments wherein the capacitances of the first bitline 104 and the ground line 111 are approximately equal, the electric potential asymptotically assumed by the first bitline 104 and the ground line 111 is approximately ½ of the precharge voltage (the ground voltage is assumed to be zero).

In some embodiments, the control circuit 112 can be adapted such that the switching voltage applied to the gate of the first charge sharing transistor 207 when electrically connecting the first bitline 104 and the ground line 111 is an overdrive voltage. In some of these embodiments, the switching voltage applied to the gate electrode of the charge sharing transistor 207 can exceed the power supply voltage Vdd by about 10% to about 20%. Thus, the conductivity of the charge sharing transistor 207 in the electrically conductive state can be increased, which allows a faster charge sharing between the first bitline 104 and the ground line 111.

At a later point of time which is denoted by a vertical dashed line 306 in FIG. 3, the control circuit 112 electrically disconnects the first bitline 104 from the ground line 111. This can be done by turning off the switching voltage applied to the charge sharing transistor 207. Thereafter, the ground line 111 can be electrically floating, and the electric potential of the ground line 111 can remain substantially constant.

Moreover, the control circuit 112 can electrically connect the first bitline 104 to ground, simultaneously to or after electrically disconnecting the first bitline 104 and the ground line. For this purpose, a switching voltage can be applied to the gate of the writing transistor 210. Thereafter, the electric potential of the first bitline 104 decreases to approximately ground voltage.

Subsequently, at a point of time denoted by vertical line 307 in FIG. 3, a voltage pulse can be applied to one of the wordlines 106, 106' connected to one of memory cells 102, 102' into which data is to be written. The voltage pulse applies a switching voltage to the access transistors 201, 202, or 201', 202', respectively, of the memory cell. Thus, the bitlines 104, 105 are electrically connected to the inverters of the memory cell, and the memory cell adopts a state in accordance with the voltages imposed to the inputs of the inverters of the memory cell by the bitlines 104, 105.

If the logical state of the memory cell changes when the inputs of the inverters of the memory cell are connected to the bitlines 104, 105, the voltage of the drains of two of the transistors of the memory cell and the electrically conductive lines connected thereto changes. For example, if data is written into the memory cell 102, and the voltage of the first bitline 104 is lowered, a change of the logical state of the memory cell 102 occurs if the voltage of the drains of the transistors 203, 205 is initially high and the voltage of the drains of the transistors 204, 206 is initially low. The drains of the transistors 203, 205 then assume a low voltage imposed by the first bitline 104, and the drains of the transistors 204, 206 assume a high voltage imposed by the second bitline 105.

Due to the charge sharing between the ground line 111 and the first bitline 104, the initial low voltage of the drains of the transistors 204, 206, being substantially equal to the electric potential of the ground line 111, is already greater than ground voltage. Hence, a smaller voltage swing of the memory cell 112 is required for changing the logical state of the memory cell 112 compared to memory devices wherein no charge sharing between one of the bitlines 104, 105 and the ground line 111 is performed.

Since the bitline 104 has been electrically connected to ground before applying the voltage pulse to the one of the wordlines, a voltage difference between gate and source of the pull up transistor 204, that is switched into a conductive state in the example, is greater than in a memory device wherein the first bitline 104 is not connected to ground after charge sharing with the ground line 111. This reduces the likelihood that the voltage difference is insufficient to overcome the threshold voltage of the pull up transistor 204, which would lead to a write failure. Therefore, in the memory device 100, the writability of the memory cells 102, 102' of the memory device 100 is improved.

After the write operation, the standby state of the column 101 of memory cells can be restored. Similar to the write operation described above, the restoring of the standby state will be described in a case wherein the electric potential of the bitline 104 was lowered in the write operation. In a case wherein the electric potential of the second bitline 105 was lowered, operations similar to those described in the following are performed, wherein actions performed on the first bitline, the first charge sharing transistor 207 and the first write transistor 208 are replaced with corresponding actions performed on the second bitline 105, the second charge sharing transistor 208 and the second write transistor 211.

For restoring the standby state, the control circuit 112 can disconnect the first bitline 104 from ground by turning off the switching voltage previously applied to the write transistor 210, and can provide an electrical connection between the first bitline 104 and the ground line 111 by applying a switching voltage to the charge sharing transistor 207. In some embodiments, the switching voltage applied to the charge sharing transistor 207 can be an overdrive voltage, as detailed above in the description of the write operation.

In FIG. 3, a vertical dashed line 308 denotes a point of time at which the first bitline 104 is disconnected from ground and electrically connected to the ground line 111. Thereafter, charge sharing between the first bitline 104 and the charge share line 111 occurs, such that the electric potential of the first bitline 104 increases and the electrical potential of the charge share line 111 decreases.

After the charge sharing between the first bitline 104 and the ground line 111, at a point of time denoted by vertical dashed line 309 in FIG. 3, the first bitline 104 and the ground line 111 can be electrically disconnected from each other, the precharge voltage can be applied to the first bitline 104, and the ground line can be connected to ground. For this purpose, the control circuit 112 can turn off the switching voltage applied to the gate of the charge sharing transistor 207, provide an electric connection between the first bitline 104 and a voltage source providing the precharge voltage, and apply a switching voltage to the gate of the grounding transistor 209.

The electric potential of the first bitline 104 then increases to the precharge voltage and the electric potential of the ground line 111 decreases to ground potential. Thus, the standby state is restored.

Due to the charge sharing that is performed after the writing of data to a memory cell in the column 101 of memory cells, i.e., after applying a voltage pulse to one of the wordlines 106, 106', a smaller amount of electric charge is required for increasing the electric potential of the first bitline 104 to the precharge voltage. Thus, the power consumption of the memory device 100 can be further reduced. In some embodiments, however, this second charge sharing process can be omitted to increase the speed of operation of the memory device 100.

The above-described scheme for writing data to the memory device 100 can be useful for SRAM memories with writability issues, where low power consumption is required and speed is not a very critical issue. For higher speed and also for optimization of overall memory power, boosted charge sharing, wherein an overdrive of the charge sharing transistors 207, 208 is used, as described above, can be employed.

Since the charge of the bitline whose electric potential is lowered in the write operation can be used to assist write by sharing its charge with the ground line 111, the raising of the electric potential of the ground line and the lower power source nodes 110, 110' comes for free or with minimal additional energy.

As described above, in some embodiments, sharing back the charge of the ground line 111 to one of the bitlines 104, 105 (charge recovery) can be performed, when the standby state is restored, if the operational speed of the memory allows. Thus, the power consumption of the memory device 100 can be further reduced, since the precharge energy for the next operating cycle of the memory device 100 is reduced.

Figure 5:
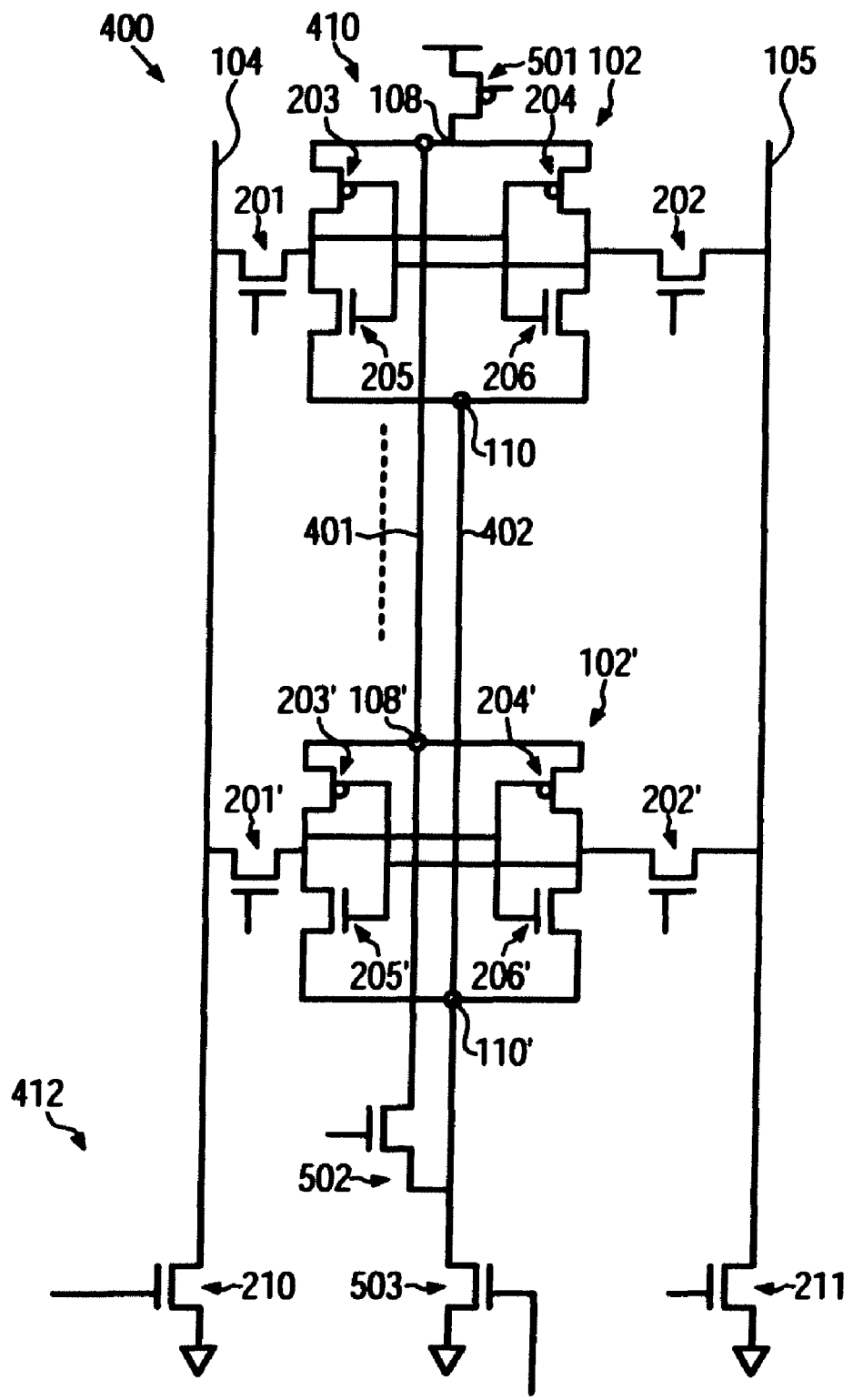
FIG. 5 shows a simplified circuit diagram of the memory device of FIG. 4.
Figure 6:
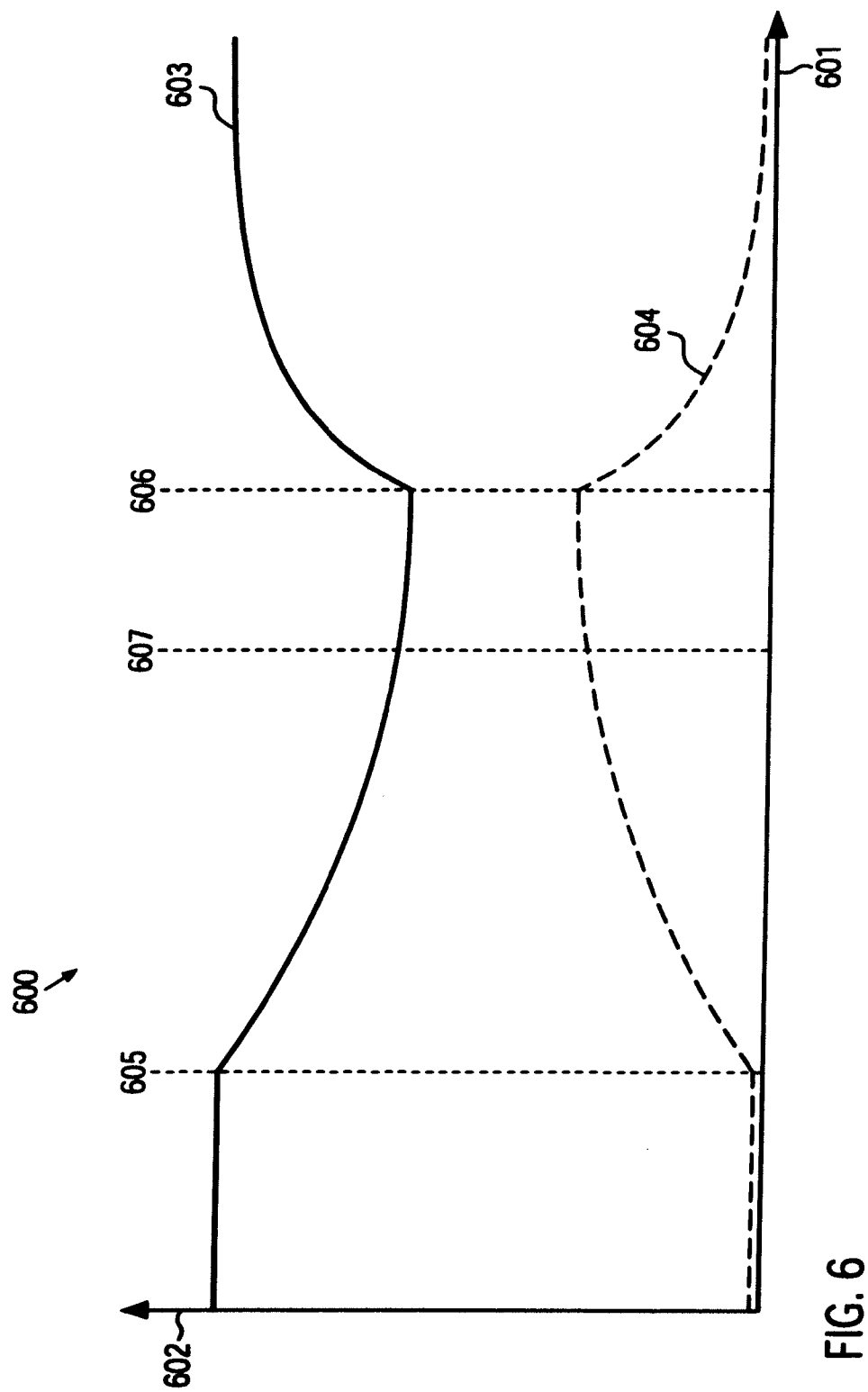
FIG. 6 shows a schematic diagram illustrating voltages in the memory device of FIG. 4.

Further embodiments will be described with reference to FIGS. 4, 5 and 6. For convenience, in FIGS. 4 and 5, and in FIGS. 1 and 2, like reference numerals have been used to denote like components and components shown in FIGS. 4 and 5 can have features corresponding to those of components denoted by like reference numerals described above with reference to FIGS. 1 and 2. For simplicity, a detailed description of such features will sometimes be omitted in the following.

Figure 4:
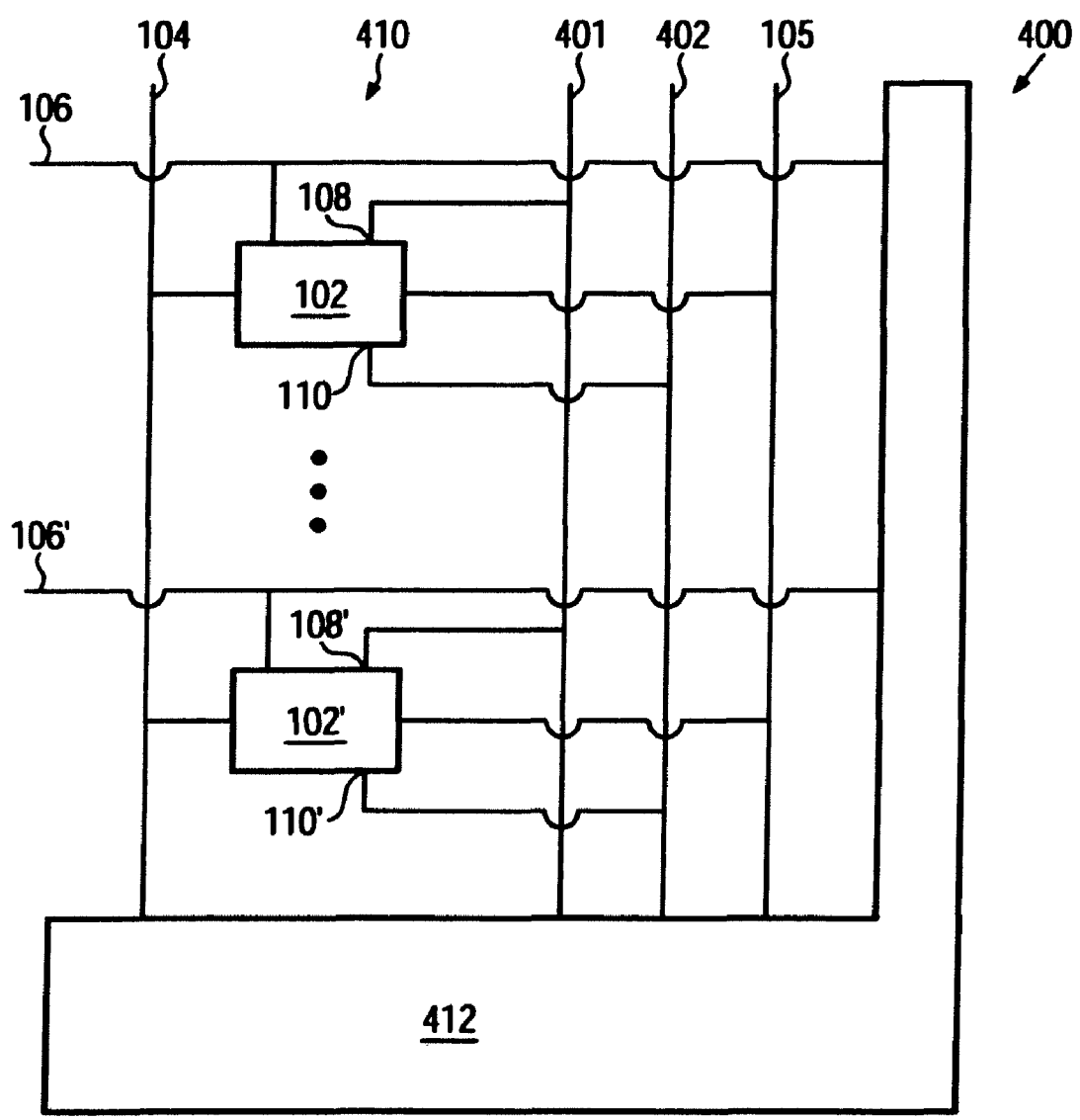
FIG. 4 shows a schematic block diagram of a memory device according to another embodiment.

FIG. 4 shows a schematic block diagram of a memory device 400 according to an embodiment. A simplified circuit diagram of the memory device 400, wherein wordlines 106, 106' and some components of a control circuit 412 of the memory device 400 have been omitted, is shown in FIG. 5.

The memory device 400 comprises a column 410 of memory cells. In addition to the column 410, the memory device 400 can comprise further columns of memory cells having a configuration corresponding to that of column 410. For simplicity, in FIG. 4, the other columns of memory cells have been omitted. The column comprises memory cells 102, 102'. Dots in FIG. 4 schematically indicate that additional memory cells can be provided between the memory cells 102, 102'. The memory cells in column 410 and in other columns of memory cells in the memory device 400 can form a matrix of memory cells.

The column 410 of the memory device 400 can further comprise a first bitline 104 and a second bitline 105 that is complementary to the first bitline 104. Each memory cell 102, 102' in the column 410 of memory cells is connected to bitlines 104, 105. In alternative embodiments, only one bitline can be provided in each column of memory cells in the memory device 400.

The memory device 400 further comprises a plurality of wordlines 106, 106', each being connected to a respective one of the memory cells 102, 102' in column 410, and optionally to memory cells in other columns of memory cells.

Each of the memory cells 102, 102' of the column 410 of memory cells comprises an upper power supply node (108 and 108', respectively) and a lower power supply node (110 and 110', respectively). The upper power supply nodes 108, 108' are connected to a power supply line 401 and the lower power supply nodes 110, 110' are connected to a ground line 402. The configuration of each of the memory cells 102, 102' can be as described above with reference to FIGS. 1 and 2.

The memory device 400 further comprises a control circuit 412 electrically connected to the wordlines 106, 106', the bitlines 104, 105, the power supply line 401 and the ground line 402. Additionally, the control circuit 412 can be electrically connected to bitlines, power supply lines and ground lines of columns of memory cells in the memory device other than column 410. Thus, the control circuit 412 can control voltages applied to the wordlines, bitlines, power supply lines and ground lines of the memory device 100 for reading and writing data to the memory device 100.

The control circuit 400 can comprise a power supply transistor 501 and a shorting transistor 502. The power supply transistor 501 is connected between a power supply providing a power supply voltage Vdd of the memory device 400 and the power supply line 401, and the shorting transistor 502 is connected between the power supply line 401 and the ground line 402. When the power supply transistor 501 is in a transmitting state, it provides an electrical connection between the power source and the power supply line 401. Otherwise, the power supply line 401 is electrically disconnected from the power source. When the shorting transistor 502 is in a transmitting state, it provides an electric connection between the power supply line 401 and the ground line 402. Otherwise, the power supply line 401 and the ground line 402 are electrically disconnected from each other.

Each of the power supply transistor 501 and the shorting transistor 502 can be switched into the transmitting state by applying a switching voltage to a gate thereof. In some embodiments, the power source transistor 501 can be a p-channel transistor and the shorting transistor 502 can be an n-channel transistor. In such embodiments, the switching voltage of the power source transistor 501 can be a low voltage, for example a voltage approximately equal to ground voltage, and the switching voltage of the shorting transistor 503 can be a high voltage, for example a voltage approximately equal to the power supply voltage Vdd. In some of these embodiments, a single signal can be applied to the power supply transistor 501 and the shorting transistor 502 for alternatively connecting the power supply line 401 to the power supply and the ground line 402. In other embodiments, different signals can be applied to the power supply transistor 501 and the shorting transistor 502 for alternatively connecting the power supply line 401 to the power supply and the ground line 402.

The control circuit 412 can further comprise a grounding transistor 503. The grounding transistor can be connected between the ground line 402 and ground. If a switching voltage is applied to a gate of the grounding transistor 503, the grounding transistor provides an electrical connection between the ground line 402 and ground. Otherwise, the ground line 402 is electrically disconnected from ground.

The control circuit 412 can further comprise a first writing transistor 210 connected between the first bitline 104 and ground, and a second writing transistor 410 connected between the second bitline 105 and ground. The writing transistors 210, 211 provide an electrical connection between the first bitline 104 and the second bitline 105, respectively, and ground, if a switching voltage is applied to a gate thereof. Otherwise, the bitlines 104, 105 are electrically disconnected from ground. Features of the writing transistors 210, 211 can correspond to those of the writing transistors in the memory device 100 described above with reference to FIGS. 1 and 2.

The control circuit 412 can further comprise power supply transistors, shorting transistors and grounding transistors connected to the power supply lines and ground lines of columns of memory cells other than column 410 in a manner corresponding to that described above for column 410.

In addition to the components described above, the control circuit 412 can further comprise circuitry for providing the functionality described in the following. For providing this functionality of the control circuit 412, known techniques for the design of integrated circuits can be employed. While the functionality of the control circuit 412 will be described with respect to operations performed in the column 410 of memory cells, the control circuit 412 can provide a corresponding functionality for operations performed in other columns of memory cells in the memory device 400.

The control circuit 412 is adapted for providing a standby state of the column 410 of memory cells. In the standby state, a precharge voltage that can, in some embodiments, be approximately equal to the power supply voltage Vdd of the memory device 400, can be applied to the bitlines 104, 105, for example by connecting the bitlines 104, 105 to a voltage source. The bitlines 104, 105 are electrically disconnected from ground in the standby state, which can be obtained by not applying the switching voltage to the write transistors 210, 211 in the standby state.

Moreover, in the standby state, the power supply voltage is applied to the power supply line 401, the ground line 402 is electrically connected to ground, and the power supply line 401 is electrically disconnected from the ground line. For this purpose, the control circuit can apply a switching voltage to the gates of the power supply transistor 501 and the grounding transistor, whereas no switching voltage is applied to the gate of the shorting transistor 502.

The control circuit 412 is further adapted for performing a write operation wherein data is written into one of the memory cells 102, 102' of the column 410 of memory cells. FIG. 6 shows a diagram illustrating electric potentials of the power supply line 402 (curve 603) and the ground line (curve 604) during a write operation. A horizontal coordinate axis 602 denotes time, and a vertical coordinate axis 602 denotes voltage. A vertical dashed line 605 denotes a point of time at which the write operation starts, and a vertical dashed line 606 denotes a point of time at which the write operation is finished, and the control circuit 412 begins to restore the standby state of the column 410 of memory cells.

When performing the write operation, the control circuit 412 lowers the electric potential of the power supply line 401 and the upper power supply nodes 108, 108' of memory cells 112, 112' electrically connected thereto compared to the power supply voltage. Additionally, the control circuit 412 raises the electrical potential of the ground line 402 and the lower power supply nodes 110, 110' of memory cells 112, 112' electrically connected thereto.

For this purpose, the control circuit 412 can electrically disconnect the power supply line 401 from the power supply by turning off the switching voltage applied to the gate of the power supply transistor 501, and electrically disconnect the ground line 402 from ground by turning off the switching voltage applied to the gate of the grounding transistor 503. Additionally, the control circuit 412 can electrically connect the power source line 401 to the ground line 403 by applying a switching voltage to the gate of the shorting transistor 502. In embodiments wherein the power supply transistor 501 is a p-channel transistor and the shorting transistor 503 is an n-channel transistor, this can comprise switching a signal applied to the gates of the power supply transistor 501 and the shorting transistor 502 from low to high.

When the electrical connection between the power supply line 401 and the ground line 402 is provided, charge sharing can occur between the power supply line 401 and the ground line 402. Due to the charge sharing, the electric potential of the power supply line 401 decreases and the electric potential of the ground line 402 increases.

In some embodiments, a resistivity of the electrical connection between the power supply line 401 and the ground line 402 can be adapted such that a full equilibration of the electric potentials of the power supply line 401 and the ground line 402 does not occur during the write operation and the electric potential of the power supply line 401 remains higher than the electric potential of the ground line.

The present subject matter is not limited to embodiments wherein the switching voltage is applied to the gate of the shorting transistor 502 during the entire write operation. In other embodiments, a pulsed operation of the shorting transistor 502 can be performed for avoiding a full equilibration of the electric potentials of the power supply line 401 and the ground line 402.

In such embodiments, the switching voltage can be applied to the gate of the shorting transistor 502 for a time that is shorter than the time required for a full equilibration of the electric potentials of the power supply line 401 and the ground line 402. Thereafter, the switching voltage is not applied to the gate of the shorting transistor 502 any more, whereas the power supply line 401 is maintained disconnected from the power supply and the ground line 402 is maintained electrically disconnected from ground during the write operation.

In addition to decreasing the electric potential of the power supply line 401 and increasing the electric potential of the ground line 402, the control circuit 412 can electrically disconnect one of the bitlines 104, 105 from the voltage source providing the precharge voltage, and can connect the one of the bitlines 104, 105 to ground by applying the switching voltage to the gate of one of the writing transistors 210, 211, while maintaining the other of the bitlines 104, 105 at the precharge voltage.

Thereafter, the control circuit 412 can apply a voltage pulse to one of the wordlines 106, 106' for switching the access transistors of one of the memory cells 102, 102' into a transmitting state. In FIG. 6, vertical dashed line 607 denotes a point of time at which the voltage pulse can applied to the wordlines 106, 106'. Thus, a data value can be written into the one of the memory cells 102, 102' in accordance with the electric potentials of the bitlines 104, 105.

If the state of the one of the memory cells 102, 102' changes in the write operation, a voltage swing of the memory cell is performed between the current electric potential of the power supply line 401 and the current electric potential of the ground line 402. Since the electric potential of the power supply line 401 has been lowered and the electric potential of the ground line 402 has been raised, a full swing between the power supply voltage of the memory device 400 and ground voltage need not be performed. Since, however, one of the bitlines 104, 105 is at the precharge voltage (that can be approximately equal to the power supply voltage in some embodiments) and the other one of the bitlines 104, 105 is at ground voltage, the transistors of the one of the memory cells 102, 102' can be switched reliably, since the threshold voltage of transistors in the one of the memory cells can reliably be overcome.

Since both the electric potential of the power supply line 401 is lowered during the write operation and the electric potential of the ground line 402 is raised, a reduced lowering of the electric potential of the power supply line 401 is required compared to memory devices wherein no raising of the electric potential of the ground line 402 is performed and only VDD lowering is performed. Therefore, up to 40% power saving can be obtained.

After the write operation, the control circuit 412 can restore the standby state of the column 410. For this purpose, the control circuit can electrically disconnect the power supply line 401 from the ground line 402, electrically connect the power supply line 401 to the power supply and electrically connect the ground line 402 to ground. This can be done by applying a respective switching voltage to the gates of the power supply transistor 501 and the grounding transistor 503 and, in embodiments wherein the switching voltage is applied to the gate of the shorting transistor 502 during the entire write operation, turning off the switching voltage applied to the gate of the shorting transistor 502. Thereafter, the electric potential of the power supply line 401 increases to the power supply voltage again, and the electric potential of the ground line 402 is reduced to ground voltage again. Additionally, the control unit 412 can electrically disconnect the one of the bitlines 104, 105 that was connected to ground in the write operation from ground by turning off the switching voltage applied to the gate of the write transistor connected between the one of the bitlines 104 105 and ground, and electrically connect the one of the bitlines 104, 105 to the precharge voltage source.

In the memory device 400, the electric potential of power supply line 401 is lowered with the help of electrically connecting it to the ground line 402. Hence, effects of Vdd lowering and ground rising can be obtained in combination with each other. This scheme can require less lowering of the electric potential of the power supply line and may allow power saving of up to 40%.

In some embodiments, after the write operation, charge sharing between the one of the bitlines 104, 105 that is connected to ground during the write operation and the ground line 402 can be performed before the ground line 402 is electrically connected to ground and the one of the bitlines 104, 105 is connected to the precharge voltage source, as will be described in the following.

For this purpose, the memory device 400 can comprise charge sharing transistors (not shown) similar to the charge sharing transistors 207, 208 described above with reference to FIG. 2. A first charge sharing transistor is connected between the ground line 402 and the bitline 104, and a second charge sharing transistor is connected between the ground line 402 and the bitline 105.

After the write operation, and after disconnection of the ground line 402 from the power supply line 401, the one of the bitlines that was connected to ground during the write operation (denoted as "the bitline" in the following for simplicity) is disconnected from ground and a switching voltage is applied to a gate of one of the switching transistors that connects the bitline to the ground line 402. Thus, an electrical connection between the bitline and the ground line 402 is provided, and charge sharing between the bitline and the ground line 402 occurs. Due to the charge sharing, the electric potential of the ground line 402 decreases and the electric potential of the bitline increases.

Subsequently, the switching voltage applied to the gate of the one of the charge sharing transistors is turned off, and the steps for restoring the standby state described above are performed.

Due to the charge sharing between the bitline and the ground line 402, a smaller amount of electric charge is required for charging the bitline to the precharge voltage when the standby state is restored. Thus, a further reduction of the power consumption of the memory device 400 can be obtained in embodiments wherein charge sharing between the bitline and the ground line 402 is performed after the write operation.

In addition to the components described above, the control circuits 112, 412 of the memory device 100 and the memory device 400 can comprise circuitry for reading data from the memory devices 100, 400. Reading data from the memory devices 100, 400 can be performed in accordance with conventional techniques for reading data from SRAM memory.

While the terms "couple" or "coupled" and "connect" or "connected" are used herein, both in the specification and the claims, none of these terms should be construed as requiring a direct connection with no intervening components. The use of the terms "couple", "coupled", "connect", and "connected" allow for indirect connections therebetween, with intervening components such as resistors, capacitors, transistors, inverters, logic gates, or the like as would be contemplated by a person of ordinary skill in the art.

Although one or more embodiments of the present invention have been described for purposes of illustration, it should be understood that various changes, modification and substitutions may be incorporated in the embodiment without departing from the spirit of the invention that is defined in the claims, which follow.

The invention claimed is:

1. A method of operating a memory cell connected to a wordline and a bitline, the memory cell comprising an upper power supply node connected to a power supply and a lower power supply node, the lower power supply node being electrically connected to a ground line, comprising:

providing a standby state of the memory cell, wherein a precharge voltage is applied to said bitline and said ground line is grounded; and performing a write operation, comprising:

electrically disconnecting said ground line from ground;

electrically connecting said bitline to said ground line for charge sharing between said bitline and said ground line;

after said charge sharing, electrically disconnecting said bitline from said ground line and connecting said bitline to ground; and applying a voltage pulse to said wordline.

2. A method according to claim 1, further comprising:

after said write operation, restoring said standby state, wherein restoring said standby state comprises:

applying said precharge voltage to said bitline; and electrically connecting said ground line to ground.

3. A method as in claim 2, wherein restoring said standby state further comprises:

before applying said precharge voltage to said bitline and before electrically connecting said ground line to ground, electrically connecting said bitline to said ground line for charge sharing between said bitline and said ground line, and electrically disconnecting said bitline and said ground line after said charge sharing.

4. A method as in claim 1, wherein said memory cell is connected to a first bitline and a second bitline, and wherein, in said write operation, one of said first and second bitline is electrically connected to said ground line for charge sharing between said one of said first and second bitline and said ground line and subsequently said one of said first and second bitline is electrically connected to ground, and the other of said first and second bitline is maintained at said precharge voltage.

5. A method as in claim 1, wherein a transistor is connected between said bitline and said ground line, and wherein electrically connecting said bitline to said ground line comprises applying a switching voltage to a gate of said transistor for switching said transistor into an electrically conductive state.

6. A method as in claim 1, wherein said voltage applied to said gate of said transistor is an overdrive voltage that exceeds a power supply voltage of said memory cell by about 10% to about 20%.

7. A method of operating a memory cell connected to a wordline and a bitline, the memory cell comprising an upper power supply node and a lower power supply node, comprising:

providing a standby state of the memory cell, wherein a power supply voltage is applied to said upper power supply node and said lower power supply node is grounded; and performing a write operation, comprising:

lowering an electric potential of said upper power supply node relative to said power supply voltage;

raising an electric potential of said lower power supply node relative to ground potential;

applying a voltage to said bitline, said voltage being selected in accordance with data to be written into said memory cell; and applying a voltage pulse to said wordline.

8. A method as in claim 7, wherein said upper power supply node is electrically connected to a power supply line, said lower power supply node is electrically connected to a ground line, and wherein lowering said electric potential of said upper power supply node and raising said electric potential of said lower power supply node comprises electrically disconnecting said power supply line from a power supply providing said power supply voltage, electrically disconnecting said ground line from ground and providing an electrical connection between said power supply line and said ground line.

9. A method of operating a memory cell as in claim 8, further comprising:

restoring said standby state after said write operation, wherein restoring said standby state comprises: electrically disconnecting said power supply line from said ground line, electrically connecting said power supply line to said power supply, and electrically connecting said ground line to ground.

10. A memory device, comprising;

a column of memory cells, a bitline and a plurality of wordlines, wherein each memory cell in said column of memory cells is connected to said bitline, each wordline is connected to a respective one of said memory cells and each memory cell comprises an upper power supply node connected to a power supply and a lower power supply node;

a ground line, wherein said lower power supply node of each memory cell in said column of memory cells is electrically connected to said ground line;

a control circuit connected to said column of memory cells, wherein said control circuit provides a standby state of said column of memory cells, and for performing a write operation, wherein, when providing said standby state, said control circuit applies a precharge voltage to said bitline and electrically connects said ground line to ground, and wherein, when performing said write operation, said control circuit:

electrically disconnects said ground line from ground;

electrically connects said bitline to said ground line for charge sharing between said bitline and said ground line;

electrically disconnects said bitline from said ground line and electrically connects said bitline to ground after said charge sharing; and applies a voltage pulse to a wordline connected to one of said memory cells for writing data into said one of said memory cells.

11. A memory device as in claim 10, wherein said control circuit restores said standby state after said write operation wherein, when restoring the standby state, the control circuit:

applies said precharge voltage to said bitline; and electrically connects said ground line to ground.

12. A memory device as in claim 11, wherein, when restoring said standby state, said control circuit electrically connects said bitline to said ground line for charge sharing between said bitline and said ground line and electrically disconnects said bitline and said ground line after said charge sharing before applying said precharge voltage to said bitline and electrically connecting said ground line to ground.

13. A memory device as in claim 10, comprising a first bitline and a second bitline, wherein each memory cell in said column of memory cells is connected to said first bitline and said second bitline, and said control circuit, when performing said write operation, connects one of said first bitline and said second bitline to said ground line for charge sharing between said one of said first and said second bitline and said ground line, and subsequently connects said one of said first bitline and said second bitline to ground, and maintains the other of said first bitline and said second bitline at said precharge voltage.

14. A memory device as in claim 13, wherein each of said memory cells is a static memory cell comprising a first access transistor, a second access transistor, a first inverter and a second inverter, wherein an output of said first inverter is electrically connected to an input of said second inverter, an output of said second inverter is electrically connected to an input of said first inverter, said input of said first inverter is connected to said first bitline via said first access transistor, said input of said second inverter is connected to said second bitline via said second access transistor, and gate electrodes of said first access transistor and said second access transistor are electrically connected to one of said wordlines associated with said memory cell.

15. A memory device as in claim 14, wherein said upper power supply node and said lower power supply node form a power supply for said first inverter and said second inverter.

16. A memory device as in claim 13, wherein a first charge sharing transistor is connected between said first bitline and said ground line, a second charge sharing transistor is connected between said second bitline and said ground line, and wherein said control circuit applies a switching voltage to a gate electrode of said first charge sharing transistor for electrically connecting said first bitline to said ground line, and to apply said switching voltage to a gate electrode of said second charge sharing transistor for electrically connecting said second bitline to said ground line.

17. A memory device as in claim 16, wherein said switching voltage exceeds a power supply voltage provided by said power supply by about 10% to about 20%.

18. A memory device as in claim 13, wherein a grounding transistor is connected between said ground line and ground, and wherein said control circuit applies a switching voltage to a gate of said grounding transistor for electrically connecting said ground line to ground.

19. A memory device as in claim 13, wherein a first writing transistor is connected between said first bitline and ground, a second writing transistor is connected between said second bitline and ground, and wherein said control circuit applies a switching voltage to a gate of said first writing transistor for grounding said first bitline, and to apply said switching voltage to a gate of said second writing transistor for grounding said second bitline.

20. A memory device, comprising:
a column of memory cells, a bitline and a plurality of wordlines, wherein each memory cell in said column of memory cells is connected to said bitline, each wordline is connected to a respective one of said memory cells and each memory cell comprises an upper power supply node electrically connected to a power supply line and a lower power supply node electrically connected to a ground line; and
a control circuit connected to said column of memory cells, wherein said control circuit provides a standby state of said column of memory cells and for performing a write operation, wherein said control circuit, when providing said standby state, applies a power supply voltage to said power supply line and connects said ground line to ground, and wherein said control circuit, when performing said write operation, (a) lowers an electric potential of said power supply line relative to said power supply voltage, (b) raises an electric potential of said ground line relative to ground potential, (c) applies a voltage to said bitline, said voltage being selected in accordance with data to be written into said memory cell, and (d) applies a voltage pulse to a wordline connected to said one of said memory cells for writing data into said one of said memory cells.

21. A memory device as in claim 20, wherein said control circuit electrically disconnects said power supply line from a power supply providing said power supply voltage, to electrically disconnect said ground line from ground, and to provide an electrical connection between said power supply line and said ground line when lowering said electric potential of said upper power supply node and raising said electric potential of said lower power supply node.

22. A memory device as in claim 21, wherein the control circuit restores the standby state after the write operation, wherein restoring the standby state comprises:
electrically disconnecting the power supply line from the ground line;
electrically connecting the power supply line to the power supply; and
electrically connecting the ground line to ground.

23. A memory device as in claim 20, wherein the control circuit comprises:
a grounding transistor connected between the ground line and ground;
a power supply transistor connected between the power supply line and the power supply; and
a shorting transistor connected between the power supply line and the ground line,
wherein the control circuit applies a switching voltage to a gate of the shorting transistor when electrically connecting the power supply line to the ground line, to apply a switching voltage to a gate of the power supply transistor when electrically connecting the power supply line to the power supply and to apply a switching voltage to a gate of the grounding transistor when grounding the ground line.

* * * * *